United States Patent [19]

Kubinec

[11] Patent Number: 4,877,980

[45] Date of Patent: Oct. 31, 1989

[54] TIME VARIANT DRIVE CIRCUIT FOR HIGH SPEED BUS DRIVER TO LIMIT OSCILLATIONS OR RINGING ON A BUS

[75] Inventor: James J. Kubinec, Incline Village, Nev.

[73] Assignee: Advanced Micro Devices, Inc., Sunnyvale, Calif.

[21] Appl. No.: 166,351

[22] Filed: Mar. 10, 1988

[51] Int. Cl.[4] .................. H03K 19/003; H03K 17/16; H03K 17/687; H03K 17/284

[52] U.S. Cl. .................. 307/542; 307/443; 307/451; 307/594; 307/585; 307/270

[58] Field of Search ............ 307/443, 270, 200 B, 307/451, 584, 585, 594, 597, 595, 603, 605, 297, 576, 579, 542.1, 542

[56] References Cited

U.S. PATENT DOCUMENTS

| | | | |
|---|---|---|---|
| 3,720,848 | 3/1973 | Schmidt, Jr. .................. | 307/579 |
| 4,365,174 | 12/1982 | Kucharewski .................. | 307/595 X |
| 4,577,124 | 3/1986 | Koike .................. | 307/605 X |
| 4,609,836 | 9/1986 | Koike .................. | 307/450 X |
| 4,686,396 | 8/1987 | Law et al. .................. | 307/270 X |
| 4,694,206 | 9/1987 | Weinberg .................. | 307/584 X |
| 4,725,747 | 2/1988 | Stein et al. .................. | 307/605 X |
| 4,752,704 | 6/1988 | Baccarani et al. .................. | 307/579 X |
| 4,754,165 | 6/1988 | Cornish .................. | 307/443 X |
| 4,760,279 | 7/1988 | Saito et al. .................. | 307/594 X |
| 4,785,203 | 11/1988 | Nakamura .................. | 307/443 X |

*Primary Examiner*—Stanley D. Miller
*Assistant Examiner*—David R. Bertelson
*Attorney, Agent, or Firm*—Skjerven, Morrill, MacPherson, Franklin & Friel

[57] ABSTRACT

A circuit is provided which modifies a digital drive signal to produce a time variant drive signal for application to a gate of a bus driver transistor. The circuit's purpose is to reduce the amplitude of ringing on a bus, due to rapid discharging of current from the bus, in order to prevent unintentional triggering of devices connected to the bus. A P-channel MOS transistor and N-channel MOS transistor are connected so that the digital drive signal is simultaneously applied to the source of the P-channel MOS transistor and to the drain of the N-channel MOS transistor. The gate of the driver transistor is connected to the drain of the P-channel MOS transistor and the source of the N-channel transistor. The width-to-length ratio of the channels of the P-channel and N-channel MOS transistors, and the gate voltages, are chosen so that application of a drive signal to the circuit causes the N-channel MOS transistor to rapidly apply a limited drive signal to the gate of the driver transistor and causes the P-channel MOS transistor to apply a gradually increasing drive signal voltage to the gate of the driver transistor. By choosing the proper width-to-length ratios and gate voltages, the time variant drive signal applied to the gate of the driver transistor will not produce objectionable ringing on the bus when the bus is intended to be at a low level.

10 Claims, 4 Drawing Sheets

TIME VARIANT DRIVE CIRCUIT FOR HIGH SPEED BUS DRIVER TO LIMIT OSCILLATIONS OR RINGING ON A BUS

BACKGROUND OF THE INVENTION

This invention relates to drivers used in integrated circuits and more particularly to time variant drives for controlling driver transistors.

The high speed drivers which are improved by the present invention are of the type consisting of an N-channel MOS (NMOS) or P-channel (PMOS) driver transistor which is controlled by a digital drive signal to, in the case of an NMOS driver transistor, rapidly shunt to ground the current supplied to a data bus, or, in the case of a PMOS driver transistor, rapidly short the data bus to the positive power supply. Shown in FIG. 1 is a typical NMOS driver transistor 10 connected to data bus 15. When a "high" drive signal $V_G$ of voltage $V_{max}$ is applied to gate 10-G of driver transistor 10, driver transistor 10 turns on and becomes saturated, thus effectively shorting to ground bus 15. This shunting corresponds to a logical zero signal on bus 15 since bus 15 is pulled low (i.e., to about zero volts). The absence of shunting (i.e., when driver transistor 10 is open) allows a positive voltage to appear on bus 15, representing a logical one. The rapid switching of driver transistor 10 enables the rapid transfer of digital information from drive signal $V_G$ to devices connected to bus 15.

The design of high speed-high current bus drivers used in integrated circuits has encountered some limitations that have their bases in the laws of physics. When the data bus is shorted to ground by the driver transistor, the rapid change of current and voltage on the bus (i.e., voltage being driven "low") causes a damped oscillation or ringing, shown in FIG. 2, due to the inherent parasitic self-inductances of the leads connected to the driver transistor combined with the inherently capacitive loads of the devices connected to the bus. The equivalent bus circuit is shown in FIG. 3, where device leads 16, 18 have self-inductances represented by inductors 20, 22 and the capacitive load is represented by capacitor 24. The bus circuit, therefore, effectively forms an LC oscillator circuit, where L equals the combined inductance of leads 16, 18, and C equals the capacitance of the load, with a ringing frequency related to $1/(LC)^{\frac{1}{2}}$, although this frequency is altered in actual circuits by additional factors. This damped ringing can cause unintentional triggering of devices connected to bus 15 if the amplitude of an oscillation cycle exceeds the logic threshold level of the devices. This situation is shown in FIG. 2 at time T, where $V_{th}$ is the logic threshold level of the devices.

Various approaches have been taken to eliminate the effect of these initial discharge transient currents. These approaches have limited the current through the driver transistor, thereby initially shunting to ground only part of the current supplied to the bus through the driver transistor and, consequently, reducing the amplitude of the ringing. This limited current through the driver transistor is then increased to the full current required to fully shunt to ground all the current supplied to the bus. The amount of current shunted at each stage is calculated to be insufficient to cause objectionable ringing on the bus.

One technique, shown in FIG. 4a, used to implement this approach is to use two MOS transistors 26, 28 in parallel as the driver, where transistor 26 only shunts to ground a portion of current supplied to bus 15 upon application of drive signal $V_G$, while transistor 28 shunts to ground the remaining current supplied to bus 15 upon application of slightly delayed drive signal $V_G'$. FIG. 4b shows the voltage ($V_{out}$) applied to the devices connected to bus 15. A problem with this prior art technique is that a fairly complex digital logic network must be designed and incorporated into the integrated circuit to provide delayed drive signal $V_G'$. Also, parallel drivers 26 and 28 must turn off quickly at the same time to avoid incurring two separate current surges on bus 15, which may, in conjunction, cause unintentional triggering of devices connected to bus 15. Another disadvantage is that the degree of ringing on the bus is a function of the sizes of drivers 26 and 28 (i.e., width-to-length ratio). Therefore, the extent of ringing on the bus is fixed once the drivers have been fabricated.

Another technique, shown in FIG. 5a, is used to provide a two-tiered drive signal to driver transistor 10, wherein the first tier is of a voltage $V_{G1}$ sufficient to cause driver transistor 10 to shunt to ground only a portion of the current supplied to bus 15. The second tier is the addition of a slightly delayed voltage $V_{G2}$, where the sum of $V_{G1}$ and $V_{G2}$ make driver transistor 10 fully conduct and shunt to ground all current supplied to bus 15. FIG. 5b shows the voltage ($V_{out}$) supplied to the devices connected to bus 15.

The above described two-tiered drive signal generator is relatively complex due to its requiring two voltage sources, and, as in the circuit of FIG. 4a, requires the two voltage sources turn off simultaneously to avoid two separate current surges on bus 15.

FIG. 6 illustrates a typical output driver stage used in CMOS circuitry. In the circuit of FIG. 6, the positive supply voltage +V is not shorted to ground when current is to be shunted away from bus 15, as in FIGS. 1–5, but instead the bus is exclusively coupled to either +V or ground. Shown in FIG. 6 are NMOS driver transistor 30 and PMOS driver transistor 32, forming the output driver stage. The gate of NMOS driver transistor 30 is coupled to a pre-driver stage comprising NMOS transistor 34 and PMOS transistor 36, while the gate of PMOS driver transistor 32 is coupled to a pre-driver stage comprising NMOS transistor 38 and PMOS transistor 40. The gates of all transistors forming the pre-driver stage are made common and coupled to an input drive signal $V_{in}$ so that upon application of a sufficiently low $V_{in}$ pre-driver transistors PMOS 36 and PMOS 40 will conduct, causing +V to be applied to the gate of NMOS driver transistor 30 and PMOS driver transistor 32. NMOS driver transistor 30 will now fully conduct and drive bus 15 to approximately ground potential. When a sufficiently positive input drive signal $V_{in}$ is applied to the gates of the pre-driver transistors, only pre-driver transistor NMOS 34 and NMOS 38 will conduct, causing PMOS driver transistor 32 to turn on and drive bus 15 to approximately +V.

SUMMARY

A simple and inexpensive circuit is herein described which provides a time variant drive signal into a driver transistor. The driver transistor operates in response to two separate drive signals provided by my inventive circuit. When an externally generated digital drive signal is applied to my inventive circuit, the circuit produces a first drive signal which immediately controls the driver transistor to shunt to ground part of the current supplied to a data bus, the change in bus current being insufficient to cause objectionable ringing on the data bus but normally sufficient to drive the bus to a low logic state. A second drive signal produced by the circuit then controls the driver transistor to gradually shunt to ground all current supplied to the bus, the change in bus current also being insufficient to cause objectionable ringing.

One embodiment of this invention consists of a driver transistor in conjunction with a P-channel MOS transistor and an N-channel MOS transistor, wherein an externally generated digital drive signal is applied simultaneously to the source of the P-channel MOS transistor and to the drain of the N-channel MOS transistor. The gate of the driver transistor is connected to the drain of the P-channel MOS transistor and the source of the N-channel MOS transistor, and the gate of the P-channel MOS transistor is connected to ground. The channel of the P-channel MOS transistor has a width-to-length ratio such that when the digital drive signal is applied to the source of the P-channel MOS transistor, the gate of the driver transistor will gradually charge to the fully drive signal voltage. The channel of the N-channel MOS transistor is sized to quickly pass the digital drive signal voltage to the gate of the driver transistor upon application of the digital drive signal to the drain of the N-channel MOS transistor. The N-channel MOS transistor has a bias voltage, $V_{bias}$, supplied to its gate which is less than the maximum digital drive signal voltage. When the digital drive signal is applied to the drain of the N-channel MOS transistor, the voltage at the source of the N-channel MOS transistor, and consequently at the gate of the driver transistor, rises to equal $V_{bias} - V_{th}$, where $V_{th}$ is the threshold voltage of the N-channel MOS transistor. $V_{bias}$ is selected so that the driver transistor will shunt the maximum current away from the bus without producing ringing which exceeds threshold levels. A gradually increasing voltage imparted to the gate of the driver transistor by the P-channel MOS transistor causes the driver transistor to increasingly shunt more current away from the bus until the bus is pulled to a minimum low level. When the externally generated digital drive signal goes low, the N-channel MOS transistor quickly discharges the gate of the driver transistor.

DETAILED DESCRIPTION

Figure 7:
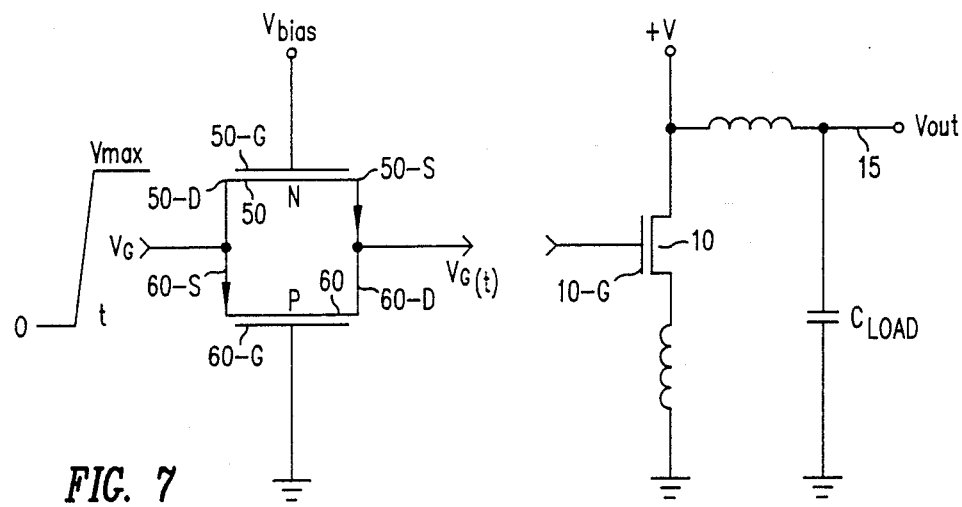
FIG. 7 is a schematic diagram of a time variant driver circuit constructed in accordance with one embodiment of the invention.
Figure 8:
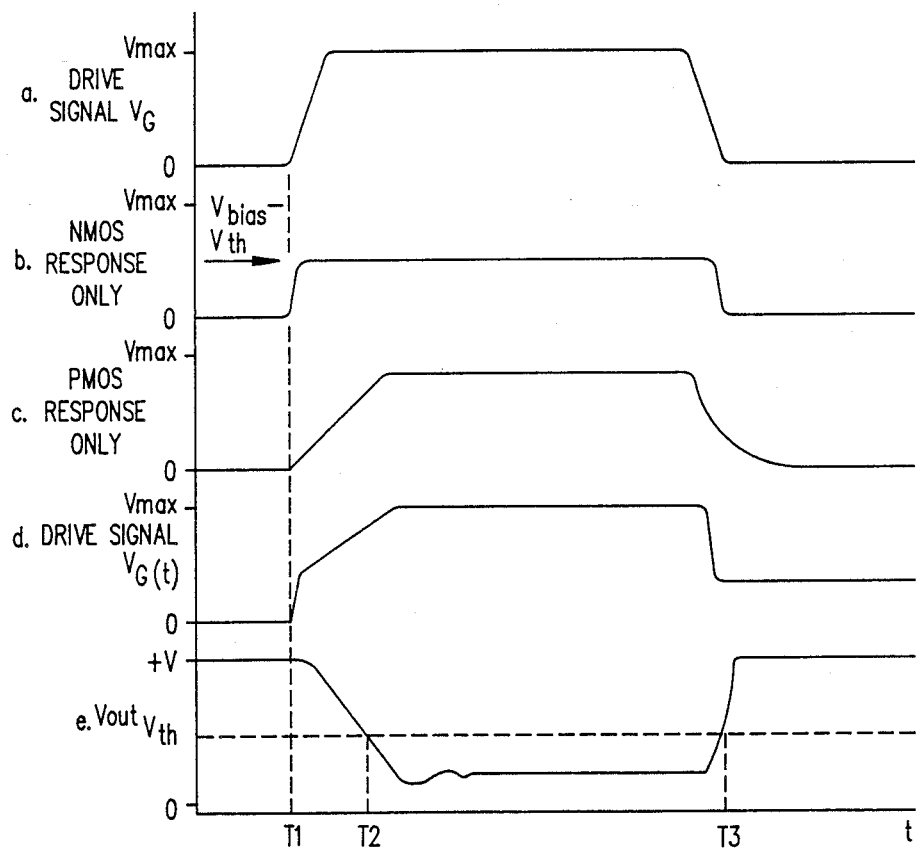
FIG. 8, graphs a–e, show graphs illustrating the voltage versus time at various points in the circuit of FIG. 7.

The present invention is a circuit which overcomes the problems of prior art time variant drive circuits discussed previously. FIG. 7 shows a schematic diagram depicting a time variant driver circuit, constructed in accordance with one embodiment of this invention, which provides a time variant drive signal to a driver transistor, such as an N-channel type, in order to eliminate objectionable ringing on a bus. In FIG. 7, N-channel MOS (NMOS) transistor 50 has its drain 50-D connected to receive digital drive signal $V_G$, shown in FIG. 8, graph a, and its source 50-S connected to gate 10-G of driver transistor 10. It is to be noted that since the driver circuit is completely bidirectional (i.e., current flows through NMOS transistor 50 and PMOS transistor 60 in both directions), the designations of terminals as source and drain are arbitrary. Bias voltage $V_{bias}$ is applied to gate 50-G of NMOS transistor 50, where $V_{bias}$ is less than the maximum digital drive signal voltage $V_{max}$. NMOS transistor 50 has a channel width-to-length ratio (W/L) such that, when $V_G$ goes high, NMOS transistor 50 rapidly charges gate 10-G of driver transistor 10, as shown in FIG. 8, graph b, at time T1. The final voltage applied to gate 10-G of driver transistor 10 due to NMOS transistor 50 will be only $V_{bias} - V_{th}$, where $V_{th}$ is the threshold voltage of NMOS transistor 50, since the voltage at the source of NMOS transistor 50 is unable to go any higher without turning off NMOS transistor 50. Bias voltage $V_{bias}$ must be chosen so that driver transistor 10 initially shunts to ground as much current as possible without producing ringing on bus 15 sufficiently large to exceed logic threshold levels. This current shunted by driver transistor 10 in response to the gate voltage will normally be sufficient to drive bus 15 to a low logic state.

P-channel MOS (PMOS) transistor 60 has its source 60-S connected to receive digital drive signal $V_G$ and its drain 60-D connected to gate 10-G of driver transistor 10. Gate 60-G of PMOS transistor 60 is grounded so as to make PMOS transistor 60 conduct when a positive voltage is applied to its source. The channel of PMOS transistor 60 has a W/L such that, when digital drive signal $V_G$ goes high, PMOS transistor 60 does not instantaneously charge gate 10-G of driver transistor 10 to the maximum digital drive signal voltage $V_{max}$, but gradually charges gate 10-G of driver transistor 10, as shown in FIG. 8, graph c, to $V_{max}$. The slope of voltage versus time in FIG. 8, graph c, is chosen so that the additional shunting to ground of current by driver transistor 10 under the control of PMOS transistor 60 will not increase the amplitude of ringing on bus 15 above the logic threshold levels of devices connected to bus 15.

The combination of the voltages applied to gate 10-G of driver transistor 10 from NMOS transistor 50 and PMOS transistor 60 is shown in FIG. 8, graph d. This time variant drive signal $V_{G(t)}$ controls driver transistor 10, thus providing time variant shunting to ground of current supplied to bus 15. The resulting voltage $V_{out}$, as measured on bus 15, is shown in FIG. 8, graph e, and represents a logical zero on bus 15 between the times T2 and T3. As seen, even though ringing is still apparent on bus 15 after digital drive signal $V_G$ goes high at time T1, $V_{out}$ does not exceed logic threshold levels. $V_{bias}$ may be adjusted as desired to allow increased ringing or to eliminate ringing altogether. Computer simulations of this time variant drive circuit coupled to the circuits to be switched can be run with various levels of $V_{bias}$ to see the switching response with the various levels of $V_{bias}$. $V_{bias}$ may be adjusted as desired to allow increased ringing or to eliminate ringing altogether.

As seen, the extent of ringing on bus 15 in response to the output of the time variant drive circuit is largely controlled by the magnitude of $V_{bias}$. Since $V_{bias}$ is adjustable after the time variant driver circuit and load circuit have been fabricated, $V_{bias}$ may later be adjusted to optimize switching response.

When digital drive signal $V_G$ goes low, the charge on gate 10-G of driver transistor 10 must be rapidly removed in order to allow the full supply voltage $+V$ to once again appear on bus 15. PMOS transistor 60 cannot effectively discharge to ground the charge on gate 10-G of driver 10 when digital drive signal $V_G$ goes low due to the relatively small channel W/L of PMOS transistor 60. NMOS transistor 50, however, having a much larger channel W/L than PMOS transistor 60, can easily discharge the charge on gate 10-G of driver transistor 10, resulting in no measurable effect on turn-off delay.

The NMOS transistor 50 and PMOS transistor 60 channel W/L dimensions may be made non-critical by using the following criteria. The W/L of NMOS transistor 50 should be made at least as large as transistors in a previous driving stage so as not to add appreciable delay between application of drive signal $V_G$ to NMOS transistor 50 and application of the lowered drive signal to the gate of driver transistor 10. At this W/L, NMOS transistor 50 is also large enough to properly discharge the gate of driver transistor 10. The W/L of PMOS transistor 60 must be small enough so that the rise of $V_{G(t)}$ to $V_{max}$ is delayed sufficiently from the NMOS transistor 50 response. This W/L will typically be 1/100 that of the NMOS transistor 50 W/L. In an actual physical embodiment of the device the channel width and length dimensions of PMOS transistor 60 were both made 2 microns. These dimensions are non-critical and are calculated using well known techniques. The desired W/L may be implemented by standard lithographic processes in the formation of the integrated circuit.

Figure 1:
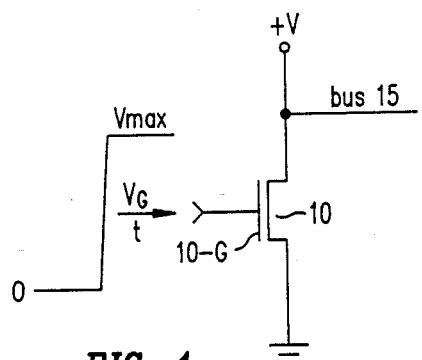
FIG. 1 shows a typical driver transistor connected to a data bus.
Figure 2:
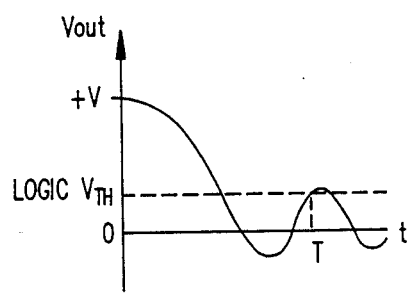
FIG. 2 shows the damped ringing effect caused by instantaneous shunting of current through the driver.
Figure 3:
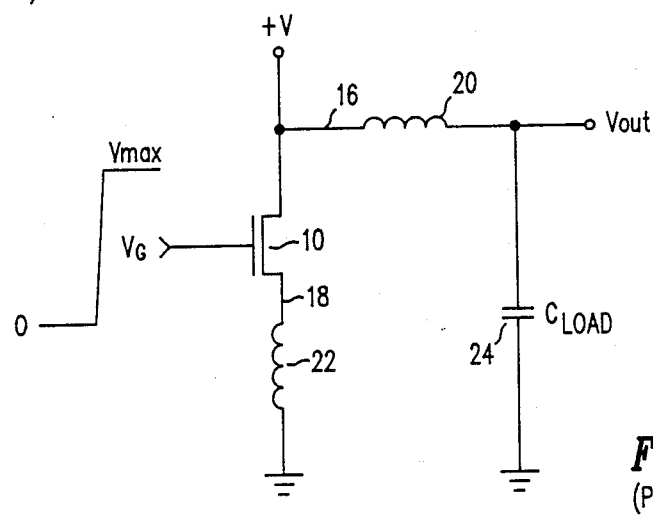
FIG. 3 is a schematic diagram of a driver transistor and a bus circuit showing inductances and capacitances inherent in the bus circuit.
Figure 4A:
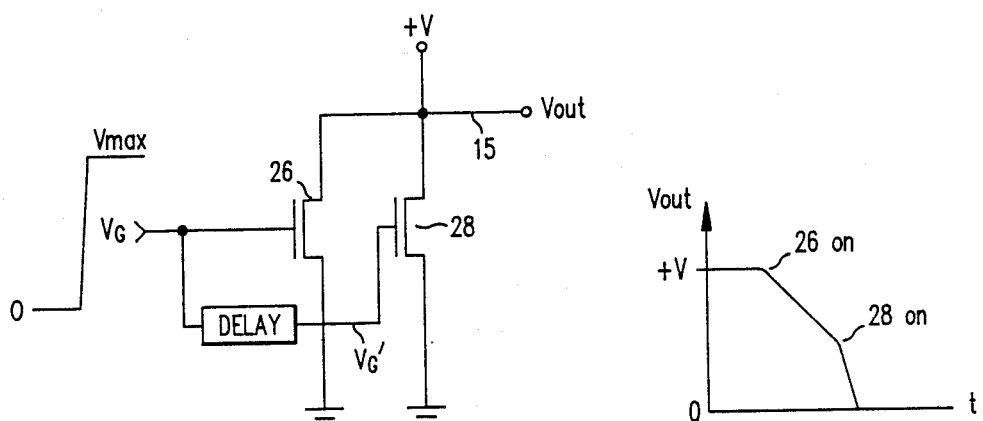
FIGS. 4a and 5a are schematic diagrams of prior art time variant bus drivers.
Figure 4B:
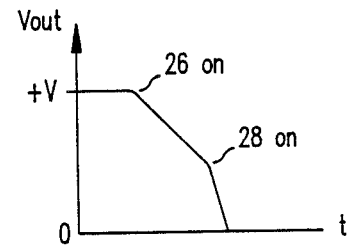
FIGS. 4b and 5b are graphs showing bus voltage versus time for the circuits of FIGS. 4a and 5a, respectively.
Figure 5A:
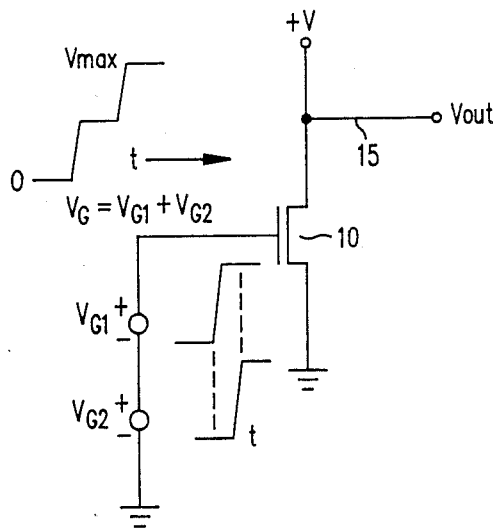
Figure 5B:
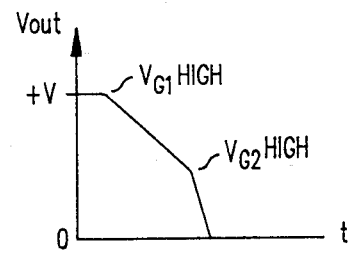
Figure 6:
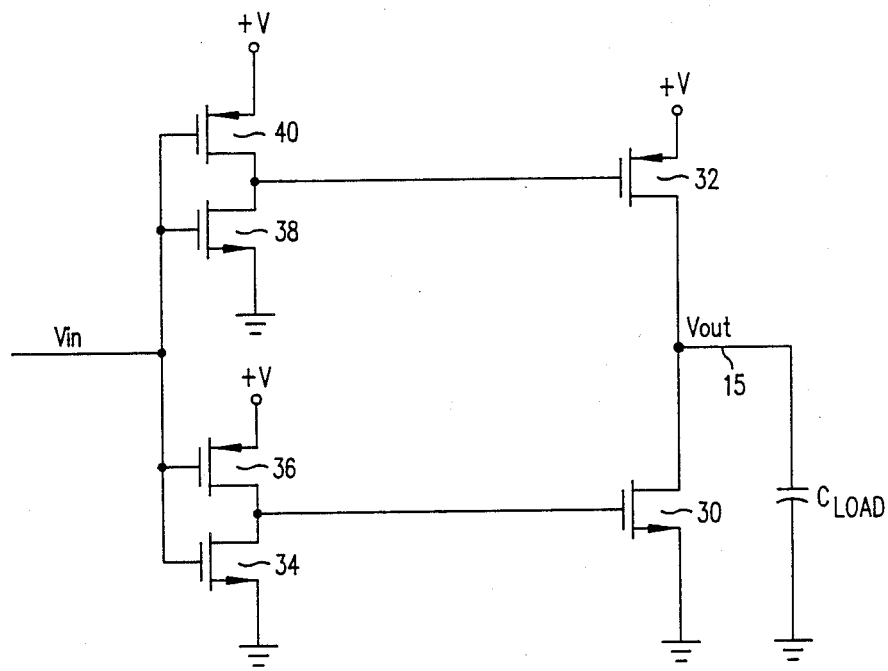
FIG. 6 is a schematic diagram of a prior art non-time variant bus driver using CMOS circuitry.
Figure 9:
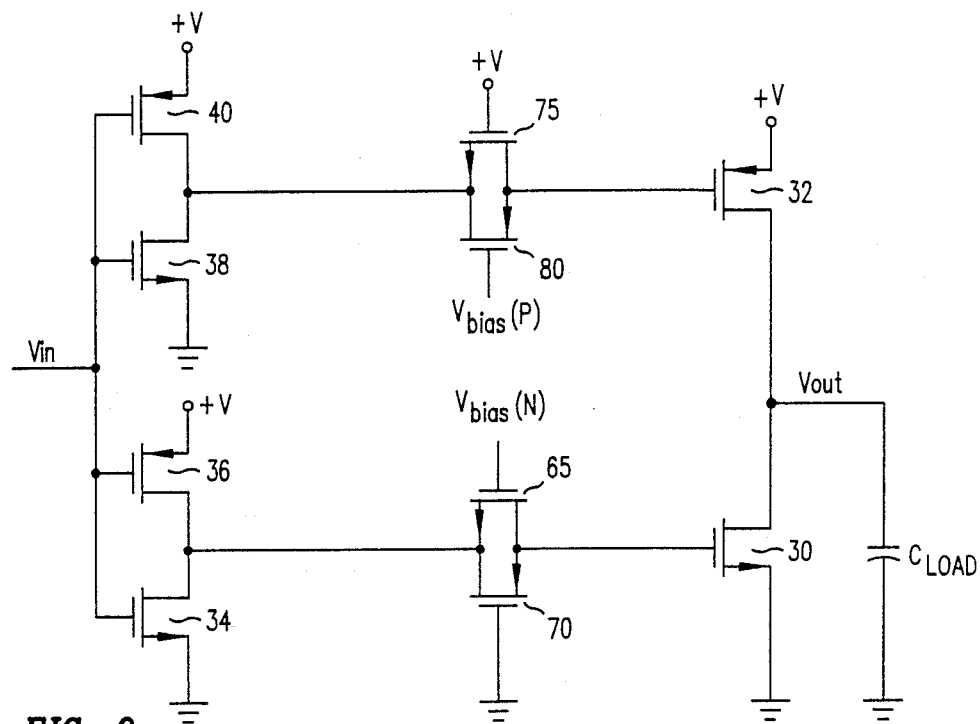
FIG. 9 is a schematic diagram of a time variant driver circuit constructed in accordance with another embodiment of the invention.

FIG. 9 shows a time variant drive circuit using CMOS technology. The circuit is similar to the prior art CMOS drive circuit of FIG. 6 except that the circuit is made time variant by the incorporation of transistors 65, 70, 75, and 80. Transistors 30, 32, 34, 36, 38, and 40 perform similarly to the corresponding transistors in the circuit of FIG. 6. The operation of NMOS transistor 65 and PMOS transistor 70, NMOS transistor 65 and PMOS transistor 70 being connected between NMOS driver transistor 30 and its corresponding pre-driver stage, is identical to the operation of NMOS transistor 50 and PMOS transistor 60, shown in FIG. 7, wherein NMOS transistor 65 has a W/L sufficient to quickly charge the gate of NMOS driver transistor 30 to $V_{bias}(N)$, and PMOS transistor 70 has a W/L such as to gradually charge the gate of NMOS driver transistor 30 to the full drive signal voltage level. The operation of NMOS transistor 75 and PMOS transistor 80, NMOS transistor 75 and PMOS transistor 80 being coupled between PMOS driver transistor 32 and its corresponding pre-driver stage, differs slightly from the operation of NMOS transistor 50 and PMOS transistor 60, shown in FIG. 7, in that when a high $V_{in}$ is applied to the gates of pre-driver transistors 38 and 40, producing a low voltage at the source of NMOS transistor 75 and at the drain of PMOS transistor 80, PMOS transistor 80, having a large channel W/L, allows the gate of PMOS driver transistor 32 to be quickly lowered to $V_{bias}(P)$. NMOS transistor 75, having a small channel W/L, slowly discharges the gate of PMOS driver transistor 32 to the low voltage thus completely turning on PMOS driver transistor 32. The channel W/L of PMOS transistor 80 and NMOS transistor 65 are large enough to allow PMOS driver transistor 32 and NMOS driver transistor 30 to turn off quickly. Thus, the operation of transistors 65, 70, 75, and 80 ensures both NMOS driver transistor 30 and PMOS driver transistor 32 have their full turn-on delayed, hence, reducing or eliminating any ringing on bus 15.

Figure 10:
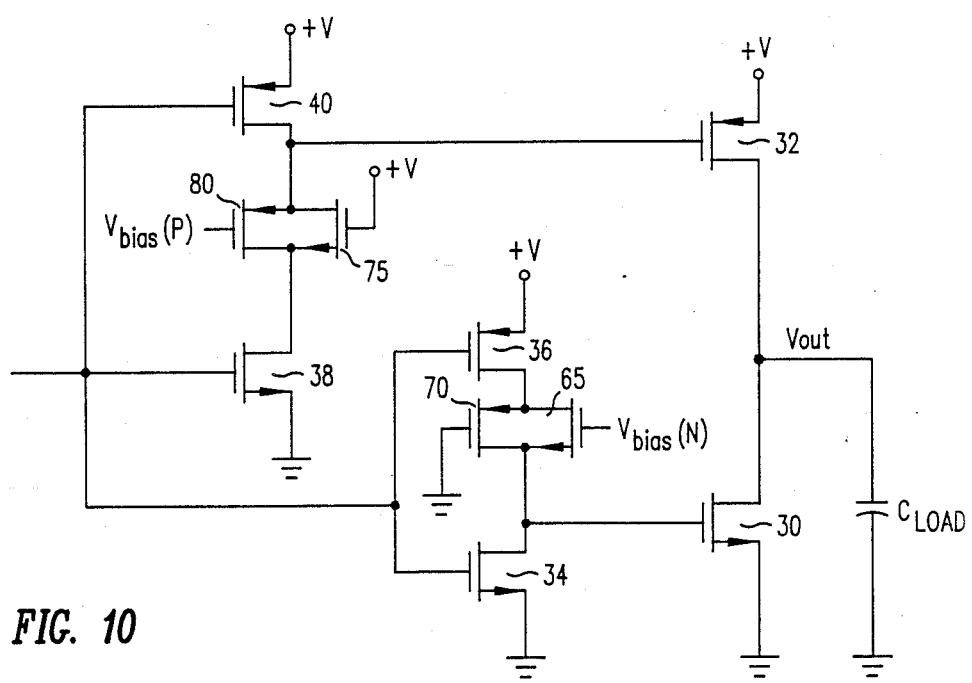
FIG. 10 is a schematic diagram of a time variant driver constructed in accordance with the preferred embodiment of the invention.

FIG. 10 shows basically the same circuit as FIG. 9 except that transistors 65, 70, 65, and 80 have been bypassed to allow PMOS driver transistor 32 and NMOS driver transistor 30 to turn off without having to conduct gate current through transistors 65, 70, 75, and 80. Transistors 30, 32, 34, 36, 38, and 40 operate similarly to the corresponding transistors in the circuit of FIG. 9. This preferred embodiment of the time variant driver circuit using CMOS technology offers all of the aforementioned benefits of the time variant gate drive, but offers no deterioration or loss of turn-off speed of the output stages. In FIG. 10, the gate of PMOS driver transistor 32 is directly coupled to the drain of PMOS pre-driver transistor 40 in the pre-driver stage so that when input drive signal $V_{in}$ is low, the gate of PMOS driver transistor 32 will immediately be driven high, turning off PMOS driver transistor 32. When $V_{in}$ is high, the gate of PMOS driver transistor 32 will be discharged through NMOS transistor 75 and PMOS transistor 80 as described in FIG. 9. Similarly, the gate of NMOS driver transistor 30 is directly coupled to the drain of NMOS transistor 34 so that upon application of a high $V_{in}$ to the gate of NMOS transistor 34, the gate of NMOS transistor 30 will immediately discharge, turning off NMOS driver transistor 30. When $V_{in}$ is low, thus signaling for NMOS driver transistor 30 to turn on, the gate of NMOS driver transistor 30 is charged via NMOS transistor 65 and PMOS transistor 70 as described in FIG. 9.

As seen, a prior art driver circuit, to be made time variant, requires no redesign of pre-driver stages or the driver transistor stage. In one embodiment, previously described, two transistors, such as NMOS transistor 50 and PMOS transistor 60, shown in FIG. 7, are merely connected between the existing driver transistor gate and a pre-driver output to form a time variant driver circuit. also, an NMOS transistor can be substituted for PMOS transistor 60 in FIG. 7, wherein the NMOS transistor has a channel W/L so that it conducts gradually and has a bias voltage applied to its gate which is higher than the maximum drive signal amplitude. A single MOS transistor of an N or P-channel type which conducts gradually may also supply a time variant drive signal to a driver transistor if switching speed of the logic state of the bus is not critical (i.e., there is no requirement for the gate of the driver transistor to charge or discharge quickly to $V_{bias}$). Also, any bidirectional field effect transistor may be substituted for the MOS transistors used in the various embodiments.

While this specification discloses preferred and alternative embodiments of the invention, it is not to be interpreted as limiting the scope of the invention. Various embodiment of this invention will become evident to those of ordinary skill in the art in light of the teachings of this specification.

What is claimed is:

1. A time variant drive circuit comprising:
   an N-channel MOS driver transistor coupled to a first circuit, said driver transistor controlling voltage applied to said first circuit in response to a time variant drive signal;
   a first field-effect transistor having a second terminal coupled to a gate of said driver transistor and having a channel with a width-to-length ratio such that a high digital drive signal applied to a first terminal of said first field-effect transistor produces a gradually increasing voltage at said second terminal of said first field-effect transistor, leveling off at a maximum drive signal voltage; and
   a second field-effect transistor having a second terminal coupled to said gate of said driver transistor and having a channel with a width-to-length ratio such that said high digital drive signal applied to a first terminal of said second field-effect transistor rapidly produces a certain voltage at said second terminal of said second field-effect transistor, said certain voltage being lower than said maximum drive signal voltage so as not to cause objectionable ringing on a bus coupling said driver transistor to said first circuit.

2. A time variant drive circuit as in claim 1 wherein said second field-effect transistor has a channel of a conductivity type opposite to a channel of said first field effect transistor.

3. A time variant drive circuit comprising:
   a P-channel MOS driver transistor coupled to a first circuit, said driver transistor controlling voltage applied to said first circuit in response to a time variant drive signal;
   a first field-effect transistor having a second terminal coupled to a gate of said driver transistor and having a channel with a width-to-length ratio such that a low digital drive signal applied to a first terminal of said first field-effect transistor produces a gradually decreasing voltage at said second terminal of said first field-effect transistor, leveling off at a minimum drive signal voltage; and
   a second field-effect transistor having a second terminal coupled to said gate of said driver transistor and having a channel with a width-to-length ratio such that said low digital drive signal applied to a first terminal of said second field-effect transistor rapidly produces a certain voltage at said second terminal of said second field-effect transistor, said certain voltage being higher than said minimum drive signal voltage so as not to cause objectionable ringing on a bus coupling said driver transistor to said first circuit.

4. A time variant drive circuit as in claim 3 wherein said second field-effect transistor has a channel of a conductivity type opposite to a channel of said first field-effect transistor.

5. A time variant driver circuit comprising:
   an N-channel MOS driver transistor coupled to a first circuit, said driver transistor controlling voltage applied to said first circuit in response to a time variant drive signal; and
   an N-channel and P-channel MOS transistor connected so that said drive signal is simultaneously applied to a drain of said N-channel MOS transistor and a source of said P-channel MOS transistor, and connected so that a gate of said driver transistor is connected to a source of said N-channel MOS transistor and a drain of said P-channel MOS transistor, said N-channel MOS transistor having a construction and a gate bias voltage so as to provide a voltage at said gate of said driver transistor, upon application of said digital drive signal to said N-channel MOS transistor, which will not produce objectionable ringing on a bus coupled between said driver transistor and said first circuit, and said P-channel MOS transistor having a construction and gate voltage so as to provide a gradually increasing voltage at said gate of said driver transistor, upon application of said digital drive signal to said P-channel MOS transistor, wherein said gradually increasing voltage continues to increase until equal to a maximum drive signal voltage.

6. A time variant drive circuit as in claim 5 wherein said gate voltage of said P-channel MOS transistor is at ground potential.

7. A CMOS drive circuit for driving a logic state of a bus high or low in response to a drive signal produced by a pre-driver stage and applied to said drive circuit, said drive circuit comprising:
   a P-channel MOS (PMOS) driver transistor and an N-channel MOS (NMOS) driver transistor coupled in series between a high state voltage source and a ground wherein said PMOS driver transistor has a source connected to said high state voltage source and said NMOS driver transistor has a drain connected to a drain of said PMOS driver transistor and a source connected to a ground, and wherein said bus is coupled to a common point of said PMOS and NMOS driver transistors;
   a first circuit for producing a time variant signal coupled between a pre-driver stage for said PMOS driver transistor and a gate of said PMOS driver transistor, said first circuit comprising a first field-effect transistor having a gate voltage and having a channel with a width-to-length ratio such that a low drive signal produced by said pre-driver stage for said PMOS transistor applied to a first terminal of said first field-effect transistor produces a gradually decreasing voltage at a second terminal of said first field-effect transistor, said gradually decreasing voltage leveling off at a minimum voltage, for application to said PMOS driver transistor, said first circuit further comprising a second field-effect transistor having a gate voltage and having a channel with a width-to-length ratio such that said low drive signal produced by said pre-driver stage for said PMOS transistor applied to a first terminal of said second field-effect transistor rapidly produces a certain voltage at a second terminal of said second field-effect transistor for application to said gate of said PMOS driver transistor, said certain voltage being higher than said minimum voltage so as to not cause objectional ringing on said bus coupled to said PMOS driver transistor;
   a second circuit for producing a time variant signal coupled between a pre-driver stage for said NMOS driver transistor and a gate of said NMOS driver transistor, said second circuit comprising a third field-effect transistor having a gate voltage and having a channel with a width-to-length ratio such that a high drive signal produced by said pre-driver stage for said NMOS transistor applied to a first terminal of said third field-effect transistor produces a gradually increasing voltage at a second terminal of said third field-effect transistor, said gradually increasing voltage leveling off at a maximum voltage, for application to said NMOS driver transistor, said second circuit further comprising a fourth field-effect transistor having a gate voltage and having a channel with a width-to-length ratio such that said high drive signal produced by said pre-driver stage for said NMOS transistor applied to a first terminal of said fourth field-effect transistor rapidly produces a certain voltage at a second terminal of said fourth field-effect transistor for application to said gate of said NMOS driver transistor, said certain voltage being lower than said high drive signal voltage so as not to cause objectional ringing on said bus coupled to said NMOS driver transistor.

8. The drive circuit of claim 7 wherein said first field-effect transistor is an NMOS transistor, said second field-effect transistor is a PMOS transistor, said third field-effect transistor is a PMOS transistor, and said fourth field-effect transistor is an NMOS transistor.

9. A CMOS drive circuit for driving a logic state of a bus high or low, said drive circuit comprising:
 a P-channel MOS (PMOS) driver transistor and an N-channel MOS (NMOS) driver transistor coupled in series between a high state voltage source and a ground wherein said PMOS drive transistor has a source connected to said high state voltage source and said NMOS driver transistor has a drain connected to a drain of said PMOS driver transistor and a source connected to a ground, and wherein said bus is coupled to a common point of said PMOS and NMOS driver transistors;
 a first circuit for producing a time variant signal coupled between an NMOS pre-driver transistor in a pre-driver stage for said PMOS driver transistor and a gate of said PMOS driver transistor so that when a high digital drive signal is applied to a gate of said NMOS pre-driver transistor, charge on said gate of said PMOS driver transistor is discharged through said first circuit, said first circuit comprising a first field-effect transistor having a gate voltage and having a channel with a width-to-length ratio such that a low voltage applied to a first terminal of said field-effect transistor produces a gradually decreasing voltage at a second terminal of said first field-effect transistor, said gradually decreasing voltage leveling off at a minimum voltage, for application to said PMOS driver transistor, said first circuit further comprising a second field-effect transistor having a gate voltage and having a channel with a width-to-length ratio such that said low voltage applied to a first terminal of said second field-effect transistor rapidly produces a certain voltage at a second terminal of said second field-effect transistor for application to said gate of said PMOS driver transistor, said certain voltage being higher than said minimum voltage so as to not cause objectional ringing on said bus coupled to said PMOS driver transistor;
 a second circuit for producing a time variant signal coupled between a PMOS pre-driver transistor in a pre-driver stage for said NMOS driver transistor and a gate of said NMOS driver transistor so that when a low digital drive signal is applied to a gate of said PMOS pre-driver transistor, voltage is applied to said gate of said NMOS driver transistor via said second circuit, said second circuit comprising a third field-effect transistor having a gate voltage and having a channel with a width-to-length ratio such that a high voltage applied to a first terminal of said third field-effect transistor produces a gradually increasing voltage at a second terminal of said third field-effect transistor, said gradually increasing voltage leveling off at a maximum voltage, for application to said NMOS driver transistor, said second circuit further comprising a fourth field-effect transistor having a gate voltage and having a channel with a width-to-length ratio such that said high voltage applied to a first terminal of said fourth field-effect transistor rapidly produces a certain voltage at a second terminal of said fourth field-effect transistor for application to said gate of said NMOS driver transistor, said certain voltage being lower than said high voltage so as not to cause objectional ringing on said bus coupled to said NMOS driver transistor.

10. The drive circuit of claim 9 wherein said first field-effect transistor is an NMOS transistor, said second field-effect transistor is a PMOS transistor, said third field-effect transistor is a PMOS transistor, and said fourth field-effect transistor is an NMOS transistor.

* * * * *